US012188999B2

(12) United States Patent
Yamaji

(10) Patent No.: US 12,188,999 B2
(45) Date of Patent: Jan. 7, 2025

(54) SUPERCONDUCTING QUANTUM CIRCUIT

(71) Applicant: NEC Corporation, Tokyo (JP)

(72) Inventor: Tomohiro Yamaji, Tokyo (JP)

(73) Assignee: NEC CORPORATION, Tokyo (JP)

(*) Notice: Subject to any disclaimer, the term of this patent is extended or adjusted under 35 U.S.C. 154(b) by 133 days.

(21) Appl. No.: 17/978,356

(22) Filed: Nov. 1, 2022

(65) Prior Publication Data
US 2023/0142878 A1 May 11, 2023

(30) Foreign Application Priority Data

Nov. 11, 2021 (JP) ................................. 2021-184241

(51) Int. Cl.
G01R 33/035 (2006.01)
G06N 10/40 (2022.01)
H10N 60/12 (2023.01)
H10N 60/80 (2023.01)
H10N 69/00 (2023.01)

(52) U.S. Cl.
CPC ......... *G01R 33/0354* (2013.01); *G06N 10/40* (2022.01); *H10N 60/12* (2023.02); *H10N 60/805* (2023.02); *H10N 69/00* (2023.02)

(58) Field of Classification Search
None
See application file for complete search history.

(56) References Cited

U.S. PATENT DOCUMENTS

| 5,334,884 A | 8/1994 | Tesche |
| 9,647,862 B2 | 5/2017 | Abutaleb et al. |
| 2019/0156238 A1* | 5/2019 | Abdo ................. H10N 60/0912 |
| 2021/0201188 A1 | 7/2021 | Yamaji et al. |

FOREIGN PATENT DOCUMENTS

| JP | H05-203712 A | 8/1993 |
| JP | 2015-108576 A | 6/2015 |
| JP | 2019-625452 A | 9/2019 |
| JP | 2021-500737 A | 1/2021 |
| JP | 2021-108308 A | 7/2021 |

* cited by examiner

Primary Examiner — Jas A Sanghera
(74) Attorney, Agent, or Firm — Sughrue Mion, PLLC

(57) ABSTRACT

A superconducting quantum circuit includes a plurality of SQUIDs (Superconducting Quantum Interference Devices) connected in parallel, each of the plurality of SQUIDs including a first superconducting line, a first Josephson junction, a second superconducting line, and a second Josephson junction connected in a loop, wherein a junction area of the first Josephson junction and a junction area of the second Josephson junction are different from each other, the plurality of SQUIDs configured to be mutually different in either one or both of: a sum of the junction area of the first Josephson junction and the junction area of the second Josephson junction; and a ratio of the junction area of the first Josephson junction to the junction area of the second Josephson junction.

15 Claims, 13 Drawing Sheets

SUPERCONDUCTING QUANTUM CIRCUIT

CROSS REFERENCE TO RELATED APPLICATIONS

This application is based upon and claims the benefit of the priority of Japanese patent application No. 2021-184241, filed on Nov. 11, 2021, the disclosure of which is incorporated herein in its entirety by reference thereto.

FIELD

The present invention relates to a superconducting quantum circuit, qubit circuit, qubit coupler, and quantum computer.

BACKGROUND

There has been widespread development of quantum computers using superconducting quantum circuits. Such a quantum computer generally includes a microwave LC resonance circuit which is made up of a superconductor and includes a nonlinear element including Josephson junctions (e.g., Superconducting Quantum Interference Device, SQUID).

The microwave LC resonance circuit is formed as a planer circuit with a superconducting material deposited on a semiconductor substrate.

PTL 1: Japanese Unexamined Patent Application Publication (Translation of PCT Application) No. 2021-500737A PTL 2: Japanese Unexamined Patent Application Publication No. 2021-108308A

SUMMARY

As described later in detail, the techniques disclosed the literatures in Citation List have a problem that it is difficult to adjust a resonance operation point.

Accordingly, it is an object of the present disclosure to provide a superconducting quantum circuit solving the above problem.

According to an aspect of the present disclosure, there is provided a superconducting quantum circuit including a plurality of SQUIDs (Superconducting Quantum Interference Devices) connected in parallel, each of the plurality of SQUIDs including a first superconducting line, a first Josephson junction, a second superconducting line, and a second Josephson junction connected in a loop, wherein a junction area of the first Josephson junction and a junction area of the second Josephson junction are different from each other, the plurality of SQUIDs configured to be mutually different in either one or both of: a sum of the junction area of the first Josephson junction and the junction area of the second Josephson junction; and a ratio of the junction area of the first Josephson junction to the junction area of the second Josephson junction.

According to the present disclosure, it is possible to facilitate the adjustment of a resonance operation point.

EXAMPLE EMBODIMENTS

Figure 1A:
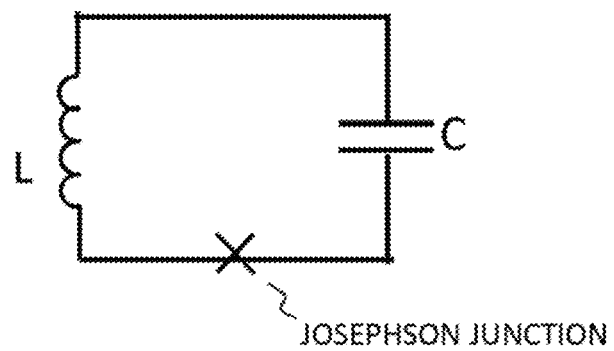
FIG. 1A is a diagram illustrating a related technology.

In the following, the above-mentioned problem is described and then some example embodiments will be described.

A SQUID behaves as a variable inductance which depends on a magnitude of a magnetic flux $\Phi$ penetrating a loop surface of the SQUID. Therefore, it is possible to adjust circuit characteristics such as a resonance frequency by applying a DC current to a control line coupled via a mutual inductance to the SQUID.

An effective critical current value $I_c$ of a SQUID depends on the magnetic flux $\Phi$. An inductance (self-inductance) L is inversely proportional to the critical current value $I_c$. A self-inductance L of the SQUID can be given as follows:

$$L = \Phi_0/(2I_c) \propto 1/I_c \quad (1)$$

where $\Phi_0$ is a magnetic flux quantum ($\Phi_0 = h/2e$, where h is the Planck constant and e is an elementary charge). That L is inversely proportional to $I_c$ is derived as below. When taking in account of a shielding current to counteract an external magnetic field flowing through the SQUID, a parameter $\beta$ in the following equation (2) is introduced. $\beta$ may be approximated to 1 for simplicity.

$$\beta = 2L \cdot I_c/\Phi_0 \quad (2)$$

When two Josephson junctions of the SQUID have the same critical current value $I_0$, a total current I flowing through the SQUID is given by the following equation (3):

$$I = I_0 \sin(\gamma A) + I_0 \sin(\gamma B) \quad (3)$$

where $\gamma A$ and $\gamma B$ are respective phase shifts (phase differences) in the two Josephson junctions, and have the relationship given by the following equation (4):

$$\gamma B - \gamma A = 2\pi\Phi/\Phi_0 \quad (4)$$

where $\Phi$ is a magnetic flux (external magnetic flux) penetrating through a loop of the SQUID.

From the equations (3) and (4), a maximum value $I_{max}$ of the current I flowing through the SQUID is given as follows:

$$I_{max} = 2I_0 |\cos(\pi\Phi/\Phi_0)| \quad (5)$$

$I_{max}$ is $2I_0$ when the magnetic flux t is an integral multiple (including zero) of the magnetic flux quantum to (i.e., $\Phi/\Phi_0 = n$), and zero when it is a half integer multiple ($\Phi/\Phi_0 = \frac{1}{2} + n$).

In a case where two Josephson junctions of the SQUID have the same critical current value $I_0$, i.e., the SQUID being symmetric, there is only one operation point (resonance operation point) (the magnetic flux phase=$\pi\Phi/\Phi_0 = n\pi$, the maximum resonance frequency), where a gradient of a resonance frequency with respect to the magnetic flux $\Phi$ becomes zero and coherence is improved, as described later. Note that the resonant operation point indicates a resonance frequency set by a DC magnetic field $\Phi_{dc}$ applied to the SQUID. A resonator using a SQUID generally has an inductance component Lc other than that of the SQUID. Thus, the inductance of the resonator is given as Lc+L, where L is an inductance of the SQUID. However, letting Lc=0 for the sake of simplicity, based the above equation (1) (where β in the above equation (2) is set to 1), a resonance angular frequency at the resonance operation point is given by the following equation (6):

$$\omega = \frac{1}{\sqrt{LC}} = \frac{1}{\sqrt{\left(\frac{\Phi_0}{2I_0}\right)C}} = \frac{\sqrt{2I_0}}{\sqrt{\Phi_0 C}} \quad (6)$$

When a resonance frequency (angular frequency) has a gradient with respect to a magnetic flux $\Phi$, the resonance frequency is varied due to, for example, a magnetic field noise present in an environment where the SQUID is arranged. Therefore, when a high degree of coherence is required, it is desirable for the resonator (SQUID) to have an operation point at which a gradient of the resonance frequency with respect to the magnetic flux is small. It is, however, known that there is a trade-off between sensitivity to a magnetic flux and ability to adjust parameters and it is difficult to achieve both.

In contrast to a resonator using a SQUID with two Josephson junctions inserted in a superconducting loop, an LC resonator using a single Josephson junction, as illustrated in FIG. 1A, has an exceptionally low sensitivity to a magnetic flux $\Phi$, but it becomes almost impossible (extremely difficult) to adjust a parameter(s) of the resonator. It is noted that, in FIG. 1A, a resonance mode of a superconducting LC resonance circuit is nonlinear due to nonlinearity of the Josephson junction and operates as a qubit, which is a quantum two-level system having two states, with energy levels unequally spaced.

Figure 1B:
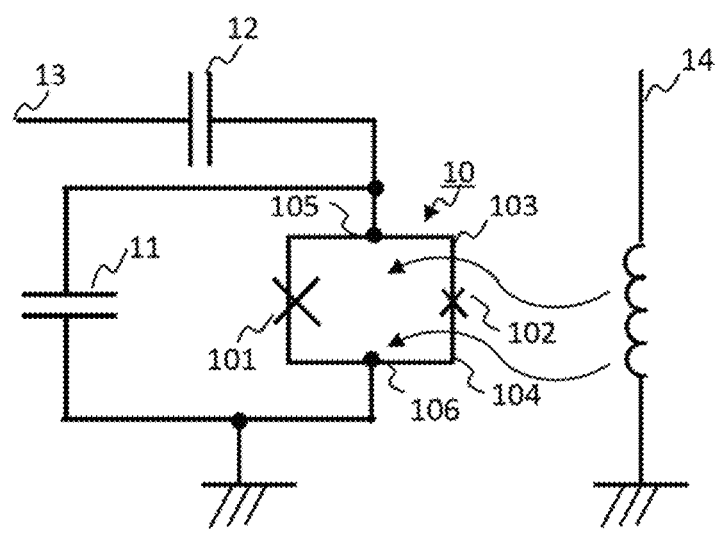
FIG. 1B is a diagram illustrating a related technology.

In order to cause a resonator using a SQUID to have an operation point with a low sensitivity to a magnetic flux $\Phi$, an asymmetric SQUID such as one illustrated in FIG. 1B is commonly used (e.g., refer to PTLs (Patent Literatures) 1 and 2). FIG. 1B illustrates a lumped element resonator using an asymmetric SQUID. Referring to FIG. 1B, the SQUID 10 has a loop structure in which a first superconducting line 103, a first Josephson junction 101, a second superconducting line 104, and a second Josephson junction 102 are connected in a loop. In the first and the second Josephson junctions, in each of which an insulator (not shown) with a thickness on an order of nanometer is sandwiched by the first and the second superconducting lines 103 and 104, a superconducting current flows due to tunneling effect of Cooper pairs in a superconductor/insulator/superconductor structure, where a Cooper pair is a pair of free electrons within a solid that act together as one quasiparticle and in large numbers give rise to superconductivity. In FIG. 1B, reference numerals 12 and 13 designate an input/output capacitor (coupling capacitor) and an input/output line, respectively. A signal (input signal or output signal) on the input/output line 13 is AC coupled to a SQUID 10. A signal source (e.g., a current source not shown) supplies a direct current to a flux line 14 with on end grounded, which functions as a magnetic field generator to generate a magnetic flux $\Phi$ through the SQUID 10. That is, the magnetic flux generated by the flux line 14 penetrates through a loop of the SQUID 10 from front to back of the drawing, or vice versa.

In the SQUID 10, a critical current value $I_0(1+x)$ of the first Josephson junction 101 and a critical current value $I_0(1-x)$ of the second Josephson junction 102 are different (where 0<x<1). Note that a critical current value of a Josephson junction is proportional to a junction area thereof. Therefore, by adjusting a ratio of a junction area of the first Josephson junction 101 to that of the second Josephson junction 102, a ratio of a critical current value of the first Josephson junction 101 to that of the second Josephson junction 102 can be adjusted.

An inductance of the SQUID 10 and a capacitor 11 form a parallel resonance circuit. In the SQUID 10, a first node 105 on the first superconducting line 103 and a second node 106 on the second superconducting line 104 are connected to opposite electrodes of the capacitor 11 and shunted by the capacitor 11. As shown in FIG. 1B, the SQUID 10 may be configured to have one end grounded.

The resonance frequency f of the resonator using the asymmetric SQUID 10 illustrated in FIG. 1B is maximized when $\Phi/\Phi_0$ (a value obtained by dividing the magnetic flux $\Phi$ penetrating through the SQUID 10 by the magnetic flux quantum ($13\Phi_0$)) is zero, while minimized when $\Phi/\Phi_0$ is one half, bringing a gradient with respect to the magnetic flux $\Phi$ zero.

In the SQUID 10, when the critical currents of the first and the second Josephson junctions 101 and 102 are $I_0(1+x)$ and $I_0(1-x)$, the maximum value of a current that can flow through the SQUID 10 may be evaluated using the following equation (7):

$$2I_0\sqrt{\cos^2\left(\pi\frac{\Phi}{\Phi_0}\right) + x^2\sin^2\left(\pi\frac{\Phi}{\Phi_0}\right)} \quad (7)$$

In equation (7), since 0<x<1, the maximum value of the current flowing through the SQUID 10 is $2I_0$ when the magnetic flux $\Phi$ is an integer multiple of the magnetic flux quantum $\Phi_0$, and the minimum value thereof is $2I_0 x$ when the magnetic flux $\Phi$ is a half integer multiple of the magnetic flux quantum $\Phi_0$. The minimum value $2I_0 x$ is x times the maximum value and is equal to a difference of the critical currents $I_0(1+x)-I_0(1-x)$ between the first and the second Josephson junctions 101 and 102. Further, from equation (7), when x=0, the minimum value of the current flowing through the SQUID 10 is zero.

Figure 1C:
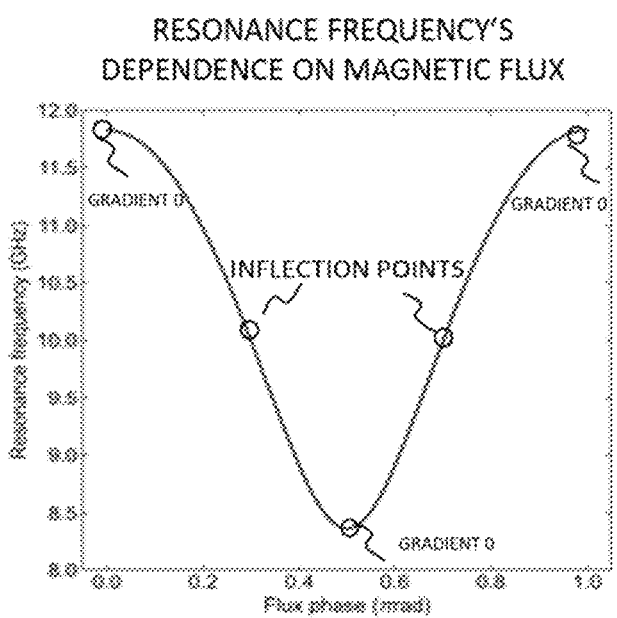
FIG. 1C is a diagram illustrating a related technology.

FIG. 1C is a diagram illustrating the relationship between the resonance frequency f of the resonator using the asymmetric SQUID 10 shown in FIG. 1B and the magnetic flux $\Phi$ penetrating through the loop of the SQUID 10. A horizontal axis (X) is the value (ranging from 0 to 1) obtained by dividing the magnetic flux $\Phi$ penetrating through the loop of the SQUID 10 by the magnetic flux quantum $\Phi_0$. A vertical axis (Y) is a resonance frequency f (in GHz (gigahertz)).

The above equation (2) indicates that the inductance L of the SQUID 10 is inversely proportional to the critical current value. Therefore, from the equation (7), the resonance frequency of the resonator using the SQUID 10 is maximized when $\Phi/\Phi_0$ (termed as a magnetic flux phase, where $\Phi$ is a magnetic flux penetrating through the loop of the SQUID 10 and $\Phi_0$ is the magnetic flux quantum) is zero (integer), while minimized when $\Phi/\Phi_0$ is one half (half-integer), with a zero gradient with respect to the magnetic flux, as shown in FIG. 1C. Further, from the above equation (6) and (7), the resonance frequency f in FIG. 1C is given as follows:

$$f = \frac{\omega}{2\pi} = \frac{1}{2\pi\sqrt{LC}} = \frac{\sqrt{2I_0\sqrt{\left\{\cos^2\left(\pi\frac{\Phi}{\Phi_0}\right) + x^2\sin^2\left(\pi\frac{\Phi}{\Phi_0}\right)\right\}_0}}}{2\pi\sqrt{\beta\Phi_0 C}} = \frac{\sqrt{I_0}}{\pi\sqrt{2\beta\Phi_0 C}}\left\{\cos^2\left(\pi\frac{\Phi}{\Phi_0}\right) + x^2\sin^2\left(\pi\frac{\Phi}{\Phi_0}\right)\right\}^{\frac{1}{4}} \quad (8)$$

Letting $$g(\theta) = \cos^2\theta + x^2\sin^2\theta \quad \left(\text{where } \theta = \pi\frac{\Phi}{\Phi_0}\right) \quad (9)$$

a first-order differential of $g(\theta)$ with respect to $\theta$ is:

$$g'(\theta) = 2(x^2-1)\cos\theta\sin\theta \quad (10)$$

A second-order differential is:

$$g''(\theta) = 2(x^2-1)\cos 2\theta \quad (11)$$

$x^2-1<0$ since $0<x<1$, and in the range of $0\leq\theta\leq\pi$, maximal (maximum) are at $\theta=0$ and $\pi$ (the horizontal axis X=0, 1 in FIG. 1C) and minimal (minimum) at $\theta=\pi/2$ (the horizontal axis X=½ in FIG. 1C), at each of which a gradient with respect to a magnetic flux phase $\theta$ ($\Phi/\Phi_0$) is zero. Note that the minimum is $\sqrt{x}$ times the maximum. Since $g''(\theta)=0$, inflection points are $\pi\Phi/\Phi_0=\pi/4$, $3\pi/4$ between $0\leq\theta\pi\leq\pi$ (X=¼, ¾ in FIG. 1C).

An asymmetric SQUID can increase the number of the resonance operation points to two (the magnetic flux phase at 0 or 0.5, the maximum or minimum resonance frequency) whereas a resonator using a symmetric SQUID can have only one (the magnetic flux phase at 0, the maximum resonance frequency).

Resonators according to the following example embodiments are realized by lines (wirings) formed by a superconducting material on a substrate. The substrate is silicon, but other electronic materials such as sapphire or compound semiconductor materials (group IV, III-V and II-VI) may be used. The substrate is preferably a single crystal but may be polycrystalline or amorphous. As the line material, Nb (niobium) or Al (aluminum) may be used, though not limited thereto. Any metal that becomes superconductive at a cryogenic temperature may be used, such as niobium nitride, indium (In), lead (Pb), tin (Sn), rhenium (Re), palladium (Pd), titanium (Ti), molybdenum (Mo), tantalum (Ta), tantalum nitride, and an alloy containing at least one of the above. In order to achieve superconductivity, the resonator circuit is used in a temperature environment of about 10 mK (millikelvin) achieved by a refrigerator.

Figure 2A:
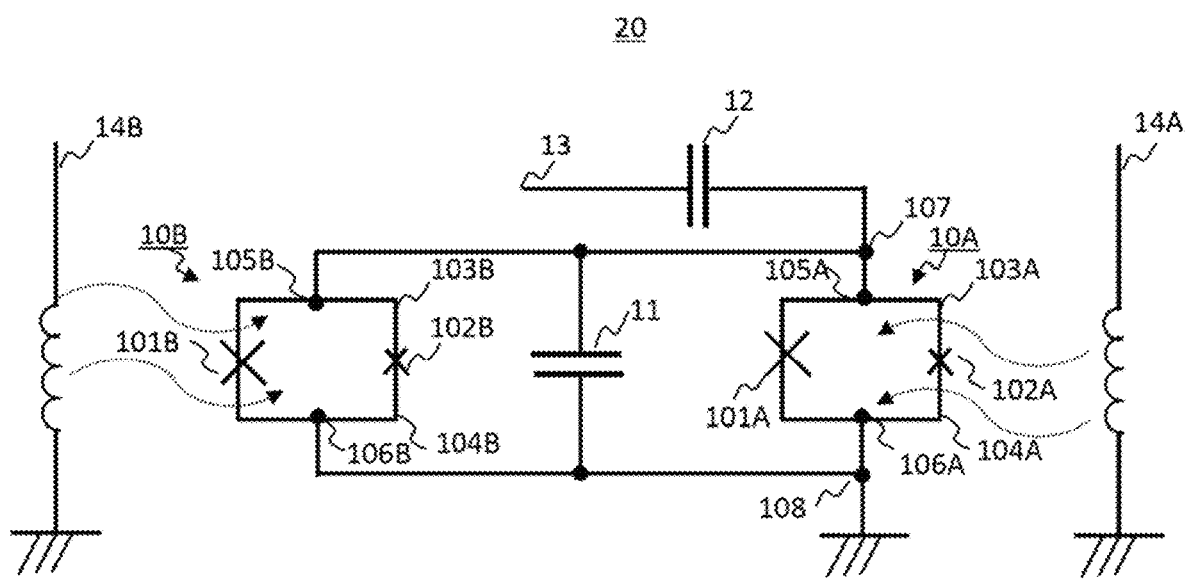
FIG. 2A is a diagram illustrating an example embodiment.

FIG. 2A is a diagram illustrating a first example embodiment. In FIG. 2A, two SQUIDs 10A and 10B are shown as a plurality of SQUIDs disposed in parallel, for the sake of simplicity, but the number of SQUIDs is not limited to two. The SQUIDs 10A and 10B connected in parallel are configured as an asymmetric SQUID 10. The SQUID 10A is configured to have a critical current value of a first Josephson junction 101A different from a critical current value of a second Josephson junction 102A. The SQUID 10B is configured to have a critical current value of a first Josephson junction 101B different from a critical current value of a second Josephson junction 102B. The SQUIDs 10A and 10B are configured in such a way that a sum (or one half) of the critical current values of the first and the second Josephson junctions or/and a ratio of the critical current value of the first Josephson junction to that of the second Josephson junction is/are different from each other between the SQUIDs 10A and 10B.

In FIG. 2A, the critical current value $I_0(1+x)$ of the first Josephson junction 101A and the critical current value $I_0(1-x)$ of the second Josephson junction 102A of the SQUID 10A are different ($0<x<1$). $I_0$ is one half (an average value) of the sum $I_0(1+x)+I_0(1-x)=2I_0$ of the critical current values of the first and the second Josephson junctions 101A and 102A of the SQUID 10A. As described above, in the SQUID 10A, the critical current value $I_0(1+x)$ of the first Josephson junction 101A corresponds (is proportional) to a junction area (size) of the first Josephson junction 101A, and the critical current value $I_0(1-x)$ of the second Josephson junction 102A corresponds (is proportional) to a junction area of the second Josephson junction 102A. The first and the second Josephson junctions 101A and 102A are made of the same insulating material. One half of the sum of the critical current values of the first and the second Josephson junctions 101A and 102A can be made to correspond to one half of the sum of the junction areas of the first and the second Josephson junctions 101A and 102A, assuming linearity holds. In FIG. 2A, reference numerals 12 and 13 designate an input/output (IO) capacitor and an input/output (IO) line, respectively. A power supply (current source) not shown supplies a direct current to a flux line 14A, which functions as a magnetic field generator to generate a magnetic flux (130A penetrating through a loop surface of the SQUID 10A.

The critical current value $I_0'(1+x')$ of the first Josephson junction 101B and the critical current value $I_0'(1-x')$ of the second Josephson junction 102B of the SQUID 10B are different ($0<x'<1$). $I_0'$ is one half (an average value) of the sum $I_0'(1+x')+I_0'(1-x')=2I_0'$ of the critical current values of the first and the second Josephson junctions 101B and 102B of the SQUID 10B. In the SQUID 10B, the critical current value $I_0'(1+x')$ of the first Josephson junction 101B corresponds (is proportional) to a junction area of the first Josephson junction 101B, and the critical current value $I_0'(1-x')$ of the second Josephson junction 102B corresponds (is proportional) to a junction area of the second Josephson junction 102B. The first and the second Josephson junctions 101B and 102B are made of the same insulating material. One half of a sum of the critical current values of the first and the second Josephson junctions 101B and 102B can be made to correspond to one half of the sum of the junction areas of the first and the second Josephson junctions 101B and 102B. A power supply (current source) not shown supplies a direct current to a flux line 14B, which functions as a magnetic field generator to generate a magnetic flux ΦB penetrating through the loop surface of the SQUID 10B.

A first node 105A of the SQUID 10A, a first node 105B of the SQUID 10B, and one end of the capacitor 11 (Cavity Capacitor; a capacitance which the resonator 20 has) are commonly connected to a node 107 (common connection node), which is connected to the input/output (IO) line 13 via the input/output (IO) capacitor 12. A second node 106A of the SQUID 10A, a second node 106B of the SQUID 10B, and the other end of the capacitor 11 are connected in common to a node 108, which is connected to ground.

An inductance of each of the SQUIDs 10A and 10B forms a parallel resonator together with the capacitor 11. The first node 105A on a first superconducting line 103A and the second node 106A on a second superconducting line 104A of the SQUID 10A are connected to opposite electrodes of the capacitor 11 and shunted by the capacitor 11. The first node 105B on a first superconducting line 103B and the second node 106B on a second superconducting line 104B of the SQUID 10B are connected to opposite electrodes of the capacitor 11 and shunted by the capacitor 11. As shown in FIG. 2A, the SQUIDs 10A and 10B may be configured to have one end grounded.

The resonator 20 is constituted as an LC resonator in which the SQUIDs 10A and 10B, and the capacitor 11 which the resonator 20 has are connected in parallel.

In this case, an effective inductance of the resonator 20 is inversely proportional to a sum of the effective critical current values of the SQUIDs 10A and 10B. That is, letting the inductances of the SQUIDs 10A and 10B, are $L_A$ and $L_B$, respectively, the parallel inductance L is as follows.

$$L = L_A \times L_B/(L_A+L_B) \qquad (12)$$

From the equation (1) where β in the equation (2) is set to 1, when a current flowing through the SQUIDs 10A and 10B are $I_A$ and $I_B$, respectively, then:

$$L_A = \Phi_0/(2I_A) \qquad (13)$$

$$L_B = \Phi_0/(2I_B) \qquad (14)$$

By substituting equation (13) and (14) into equation (12), the following equation (15) is obtained:

$$L = \Phi_0/(2I_A) * \Phi_0/(2I_B)/\{\Phi_0/(2I_A) + \Phi_0/(2I_B)\} = \Phi_0/\{2(I_A + I_B)\} \qquad (15)$$

In each of the SQUIDs 10A and 10B, when $\Phi/\Phi_0$ (magnetic flux phase: a ratio of the magnetic flux $\Phi$ to the magnetic flux quantum $\Phi_0$) is an integer (n) or a half integer (½+n), a gradient of the critical current with respect to the magnetic flux $\Phi$ is zero. Therefore, in each of the SQUIDs 10A and 10B, when the magnetic flux phase $\Phi/\Phi_0$ is an integer and half-integer, each of the SQUIDs 10A and 10B has sensitivity to the magnetic flux $\Phi$ suppressed.

By setting the maximum and minimum values of the critical currents of N SQUIDs connected in parallel to mutually different values, it is possible to achieve at maximum $2^N$ resonance operation points with mutually different resonance frequencies.

The critical current values $I_{A1}$ and $I_{A2}$ of the two Josephson junctions 101A and 102A of the SQUID 10A are different from each other as follows:

$$I_{A1} = I_0(1+x) \qquad (16)$$

$$I_{A2} = I_0(1-x) \qquad (17)$$

where $I_0$ is one half (an average critical current value) of a sum of the critical current values of the first and the second Josephson junctions 101A and 102A of the SQUID 10A, and x is a parameter representing a degree of asymmetry of the SQUID 10A (0<x<1).

The critical current values $I_{B1}'$ and $I_{B2}'$ of the two Josephson junctions 101B and 102B of the SQUID 10B are different from each other as follows:

$$I_{B1}' = I_0'(1+x') \qquad (18)$$

$$I_{B2}' = I_0'(1-x') \qquad (19)$$

where $I_0'$ is one half (an average critical current value) of a sum of the critical current values of the first and the second Josephson junctions 101B and 102B of the SQUID 10B, and x' is a parameter representing a degree of asymmetry of the SQUID 10B (0<x'<1).

Letting r be a ratio of the critical current value $I_{A1}$ to $I_{A2}$ of the SQUID 10A, $$r = (1-x)/(1+x) \qquad (20)$$

then, x is given as $$x = (1-r)/(1+r) \qquad (21)$$

The degree of asymmetry x corresponds one-to-one to the ratio r of the critical current value $I_{A1}$ to $I_{A2}$ of the SQUID 10A. Likewise, letting r' be a ratio of the critical current value $I_{B1}'$ to $I_{B2}'$ of the SQUID 10B, $$r' = (1-x')/(1+x') \qquad (22)$$

then, x' is given as $$x' = (1-r')/(1+r') \qquad (23)$$

The degree of asymmetry x' corresponds one-to-one to the ratio r' of the critical current value $I_{B1}'$ to $I_{B2}'$ of the SQUID 10B.

In the SQUID 10A, currents flowing through the first and the second Josephson junctions 101A and 102A are $I_0(1+x)$ and $I_0(1-x)$, respectively. From the above equation (7), a critical current value of the SQUID 10A (a maximum value of the current that can flow through the SQUID10A) can be given by the following equation (24):

$$2I_0\sqrt{\cos^2\left(\pi\frac{\Phi_A}{\Phi_0}\right) + x^2\sin^2\left(\pi\frac{\Phi_A}{\Phi_0}\right)} \qquad (24)$$

where $\Phi_A$ is a magnetic flux penetrating through the loop of the SQUID 10A.

In SQUID 10B, currents flowing through the first and the second Josephson junctions 101B and 102B are $I_0'(1+x')$ and $I_0'(1-x')$, respectively. A critical current value of the SQUID 10B (a maximum value of the current that can flow through the SQUID) can be given by the following equation (25):

$$2I_0'\sqrt{\cos^2\left(\pi\frac{\Phi_B}{\Phi_0}\right) + x'^2\sin^2\left(\pi\frac{\Phi_B}{\Phi_0}\right)} \qquad (25)$$

where $\Phi_B$ is a magnetic flux penetrating through the loop of the SQUID 10B.

From the above equation (24), the critical current value $I_A$ of the SQUID 10A takes:

a maximum value: $2I_0$ when the magnetic flux $\Phi_A$ is an integral multiple of the magnetic flux quantum $\Phi_0$; and a minimum value: $2I_0 x$ when the magnetic flux $\Phi_A$ is a half-integer multiple of the magnetic flux quantum $\Phi_0$.

From the above equation (25), the critical current value $I_B$ of the SQUID 10B takes:

a maximum value: $2I_0'$ when the magnetic flux $\Phi_B$ is an integral multiple of the magnetic flux quantum $\Phi_0$; and a minimum value: $2I_0'x'$ when the magnetic flux $\Phi_B$ is a half-integer multiple of the magnetic flux quantum $\Phi_0$.

With respect to the magnetic fluxes $\Phi_A$ and $\Phi_B$ penetrating through the loops of the SQUIDs 10A and 10B, respectively, there are four combinations of a sum ($I_A+I_B$) of the current values flowing through the SQUIDs 10A and 10B, respectively:

a) $2I_0+2I_0'(\Phi A/\Phi_0=n, \Phi B/\Phi_0=n')$ (26)

b) $2xI_0+2I_0'(\Phi A/\Phi_0=\frac{1}{2}+n, \Phi B/\Phi_0=n')$ (27)

c) $2I_0+2x'I_0'(\Phi A/\Phi_0=n, \Phi B/\Phi_0=n'+\frac{1}{2})$ (28)

d) $2xI_0+2x'I_0'(\Phi A/\Phi_0=\frac{1}{2}+n, \Phi B/\Phi_0=\frac{1}{2}+n')$ (29)

These correspond to the resonance operation points. That is, there are four resonance operation points in a range where $\Phi_A/\Phi_0$ and $\Phi_B/\Phi_0$ are from 0 to ½.

In the following, the resonance frequency of the resonator 20 is assumed to be given by the following equation (30):

$$f = \frac{\omega}{2\pi} = \frac{1}{2\pi\sqrt{LC}} = \frac{1}{2\pi\sqrt{\{\Phi_0/2(I_A+I_B)\}C}} = \frac{\sqrt{I_A+I_B}}{\pi\sqrt{2\Phi_0 C}} \quad (30)$$

The resonance frequencies $f_a$, $f_b$, $f_c$, and $f_d$ at the four resonance operation points of the above equation (26) to (29) are given by equations (31) to (34):

$$f_a = \frac{\sqrt{I_0+I_0'}}{\pi\sqrt{2\Phi_0 C}} \quad (31)$$

$$f_b = \frac{\sqrt{xI_0+I_0'}}{\pi\sqrt{2\Phi_0 C}} \quad (32)$$

$$f_c = \frac{\sqrt{I_0+x'I_0'}}{\pi\sqrt{2\Phi_0 C}} \quad (33)$$

$$f_d = \frac{\sqrt{xI_0+x'I_0'}}{\pi\sqrt{2\Phi_0 C}} \quad (34)$$

(A) In a case where the SQUIDs 10A and 10B have average critical current values equal but asymmetries different to each other, i.e., $I_0=I_0'$ and $x \neq x'$, $f_a > f_b, f_c > f_d$ (35)

A magnitude relationship between $f_b$ and $f_c$ is swapped depending on a magnitude relationship between x and x'. When x>x', $f_a > f_b > f_c > f_d$ (36)

When x<x', $f_a > f_c > f_b > f_d$ (37)

Therefore, there are four different resonance operation points.
(B) In a case where the SQUIDs 10A and 10B have asymmetries equal but average critical current values different to each other, i.e., $I_0 \neq I_0'$ and x=x', $f_a > f_b, f_c > f_d$ (38)

A magnitude relationship between $f_b$ and $f_c$ is swapped depending on a magnitude relationship between $I_0$ and $I_0'$. When $I_0 < I_0'$, $f_a > f_b > f_c > f_d$ (39)

When $I_0 > I_0'$, $f_a > f_c > f_b > f_d$ (40)

Therefore, there are four different resonance operation points.
(C) In a case where the SQUIDs 10A and 10B have average critical current values and asymmetries, both different to each other, i.e., $I_0 \neq I_0'$, and $x \neq x'$, $f_a > f_b, f_c > f_d$ (41)

A magnitude relationship between $f_b$ and $f_c$ is swapped depending on a magnitude relationship between $I_0$ and $I_0'$ and that between x and x'.
That is, when $I_0'/I_0 > (1-x)/(1-x')$, $f_a > f_b > f_c > f_d$ (42)

When $I_0'/I_0 < (1-x)/(1-x')$, $f_a > f_c > f_b > f_d$ (43)

Therefore, there are four different resonance operation points.

However, when $I_0'/I_0 = (1-x)/(1-x')$, $f_a > f_b = f_c > f_d$ (44)

In this case, the number of resonance operation points is degenerated to three. Therefore, in the case (C) where the SQUIDs 10A and 10B have the average critical current values ($I_0$, $I_0'$) and the asymmetries (x, x') both different from each other, the SQUIDs 10A and 10B may have the average critical current values and the asymmetries set so as to have four different resonance operation points.
(D) In a case where the SQUIDs 10A and 10B have average critical current values and asymmetries, both equal to each other, i.e., $I_0=I_0'$, and x=x', $f_a > f_b = f_c > f_d$ (45)

There are three resonance operation points.

In the two asymmetric SQUIDs 10A and 10B connected in parallel, when the current values ($I_0$, $I_0'$), which are one half of the sum ($2I_0$, $2I_0'$) of critical current values of two Josephson junctions of each SQUID, and/or the parameters x and x' representing a degree of asymmetry (corresponding to a ratio between the critical current values of the two Josephson junctions) are different to each other, $2^2=4$ different resonance operation points can be achieved. Likewise, in a case of N asymmetric SQUIDs connected in parallel, 2N different resonance operation points can be achieved by varying the current value $I_0$ and/or $I_0'$ which is one half of the sum: $2I_0$ and/or $2I_0'$ of the critical current values of the two Josephson junctions of each SQUID and the value of the parameter x and/or x' among N asymmetric SQUIDs so as to avoid the situation (degeneration) described in (C) above.

In the present example embodiment described above, in order to adjust a resonance operation point (an operation point that has a magnetic field gradient of a value zero and is resistant to magnetic field noise) of the resonator 20 that includes the SQUIDs 10A and 10B, a direct current is applied from the flux lines 14A and 14B to apply a static magnetic field to the SQUIDs 10A and 10B, respectively. It is noted that in FIG. 2A, with a signal of frequency $\omega_0$ being supplied from an input/output line 13 and the resonance frequency when a static magnetic field is applied to the SQUIDs 10A and 10B being $\omega_0$, by applying from the flux lines 14A and 14B a sufficiently strong pump beam (microwave current+direct current) of frequency $\omega_p$ close to twice the resonance frequency $\omega_0$, parametric oscillation may be invoked outside an operation point resistant to magnetic field noise under conditions where there is a magnetic field gradient.

Figure 2B:
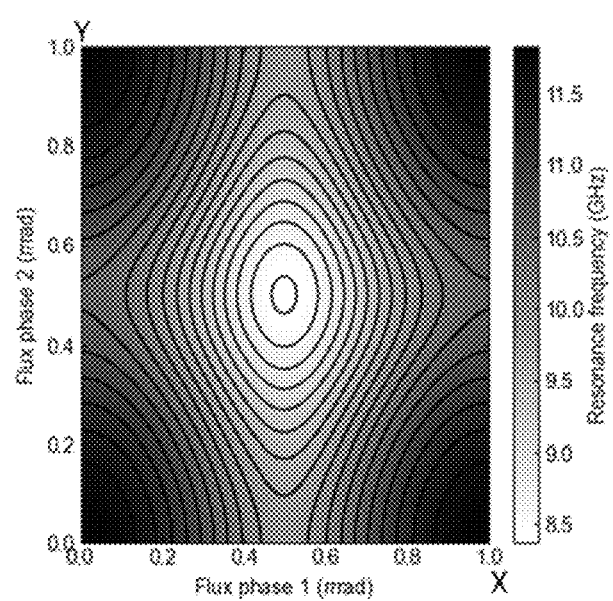
FIG. 2B is a diagram illustrating an example embodiment.

FIG. 2B is a diagram showing a calculation result of resonance frequencies of the resonator 20 of FIG. 2A using a contour line diagram. X-axis corresponds to $\Phi_A/\Phi_0$ and Y-axis corresponds to $\Phi_B/\Phi_0$ ($\Phi_A$ and $\Phi_B$ are magnetic fluxes penetrating through loops of the SQUIDs 10A and 10B of FIG. 2A, respectively). In FIG. 2B, the higher the value of the resonance frequency, the darker the grayscale. A valley (gradient=0) at (X, Y)=(0.5, 0.5), a top (gradient=0) at (X, Y)=(0, 0), (0, 1), (1, 0), (1, 1), and a medium level at (X, Y)=(0.5, 0), (0.5, 1), (0, 0.5), (1, 0.5).

In general, when a circuit pattern forms a large loop, a magnetic field is generated from the loop and interferes with other circuits. When an area of the loop increases, an unwanted signal is induced in the loop due to influence of an external magnetic field. Therefore, it is desirable to increase a distance between the SQUIDs 10A and 10B to reduce contribution of a closed loop current due to the loops between the adjacent SQUIDs 10A and 10B. For instance, for the SQUIDs 10A and 10B processed to a micrometer size, a distance therebetween may be on the order of millimeters.

Figure 3:
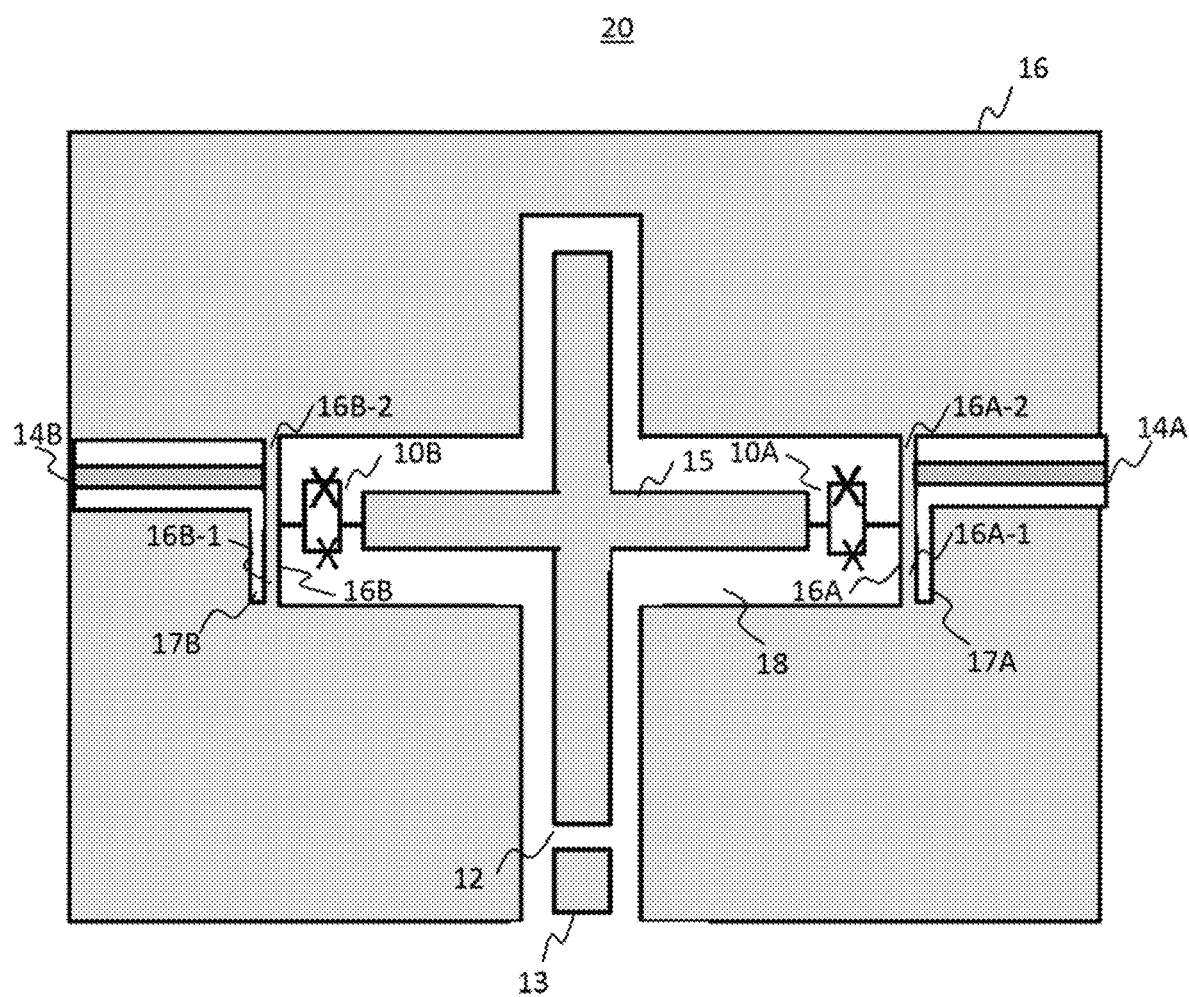
FIG. 3 is a diagram schematically illustrating a configuration example of an example embodiment.

FIG. 3 is a diagram illustrating a lumped element resonator 20. FIG. 3 schematically illustrates a part of a wiring pattern (plane circuit) of the resonator 20 with SQUIDs 10A and 10B and a single electrode 15 formed on the circuit surface (main surface) of a silicon substrate. Areas (gray colored) of the electrode 15 and a ground pattern 16, indicate areas where a superconducting thin film is vapor-deposited on a silicon substrate, and a white portion 18 indicates an exposed area of the silicon substrate (a gap of a coplanar waveguide). The electrode 15 is of a cruciform shape with four arms extending to top, bottom, left and right. The resonator 20 is formed of a coplanar plane circuit in which a signal line and the ground pattern 16 surrounding the signal line (signal electrode) are placed on the same plane on the silicon substrate. In FIG. 3, a capacitor 11 in FIG. 2A is formed in a gap between the electrode 15 and the ground pattern 16 facing each other. In FIG. 3, one end of each of the two SQUIDs 10A and 10B is connected to one end of the electrode 15, and the other end of each of the two SQUIDs 10A and 10B is connected to the ground pattern 16. The electrode 15 has a cruciform shape in which a first pattern (first and second arms) having both ends along a length connected to one ends of the SQUIDs 10A and 10B intersects a second pattern (third and four arms) having one end along a length capacitively coupled to an input/output line 13. It is noted that the planar shape of the electrode 15 is not limited to the example illustrated in FIG. 3.

The electrode 15 and the ground pattern 16 may be made of superconducting materials such as Nb and Al. The SQUIDs 10A and 10B may also be constituted by wiring patterns of an Nb—Al based superconducting conductor formed on the silicon substrate. The Josephson junctions may be formed by using known techniques (e.g., a thin Al film may be formed on a Nb wiring and an AlOx film with a predetermined thickness may be formed by thermally oxidizing the Al surface, and then an upper Nb film may be deposited).

A power supply (current source) not shown in the drawing supplies a direct current signal to each of the flux lines 14A and 14B. The ground pattern 16 is provided on both longitudinal sides of each of the flux lines 14A and 14B. The ground pattern 16 are arranged facing via a gap with each longitudinal side of each of the flux lines 14A and 14B. The flux lines 14A and 14B have longitudinal one ends made in contact with one longitudinal sides of line-shaped ground patterns (ground lines) 16A and 16B, respectively. The ground lines 16A and 16B face the SQUIDs 10A and 10B, respectively, on other longitudinal sides. On the ground pattern 16 (the ground pattern provided facing a side of each of the flux lines 14A and 14B in the longitudinal direction with a gap therebetween), notches 17A and 17B are provided running along ground lines 16A-1 and 16B-1 that are made in contact with the longitudinal one ends of the flux lines 14A and 14B, respectively, and extend in directions orthogonal to the longitudinal directions of the flux lines 14A and 14B.

A current flowing through the flux line 14A (or 14B) is divided at the one longitudinal end thereof to the ground line 16A-1 and a ground line 16A-2 (or the ground line 16B-1 and a ground line 16B-2). A current flowing through the ground line 16A-2 (or 16B-2) and a current flowing through the ground line 16A-1 (or 16B-1) in an opposite direction do not cancel out a magnetic field applied to the loop of the SQUID 10A (or the SQUID 10B). That is, a line length of the ground line 16A-1 extending along the notch 17A is longer than the ground line 16A-2 by approximately a length of the notch 17A, and a magnetic field generated by the current flowing through the ground line 16A-1 (a first magnetic field penetrating through a loop of the SQUID 10A) is larger than a magnetic field generated by the current flowing through the ground line 16A-2 (a second magnetic field penetrating through the loop of the SQUID 10A in the opposite direction to the first magnetic field). As a result, the configuration of the flux line 14A and the ground lines 16A-1 and 16A-2 illustrated in FIG. 3 enables efficient generation of the magnetic field applied to the loop of the SQUID 10A. Likewise, regarding the flux line 14B, since a magnetic field generated by a current flowing through the ground line 16B-1 (a first magnetic field penetrating through a loop of the SQUID 10B) is larger than a magnetic field generated by a current flowing through the ground line 16B-2 (a second magnetic field penetrating through the loop of the SQUID 10B in an opposite direction to the first magnetic field), the magnetic field applied to the loop of the SQUID 10B can be efficiently generated. Line widths of the ground lines 16A-1 and 16A-2 (or 16B-1 and 16B-2) do not have to be the same and may differ from each other, such as the ground line 16A-1 (or 16B-1) being wider than the ground line 16A-2 (or 16B-2). It is noted that the flux lines 14A and 14B illustrated in FIG. 3 are merely examples, and any configuration other than that in FIG. 3 may, as a matter of course, be used as long as it satisfies a condition for efficiently generating a magnetic field applied to the loop of the SQUID.

In FIG. 3, the resonator 20 has two SQUIDs 10A and 10B connected in parallel, but the number of SQUIDs is not limited to two.

Figure 4:
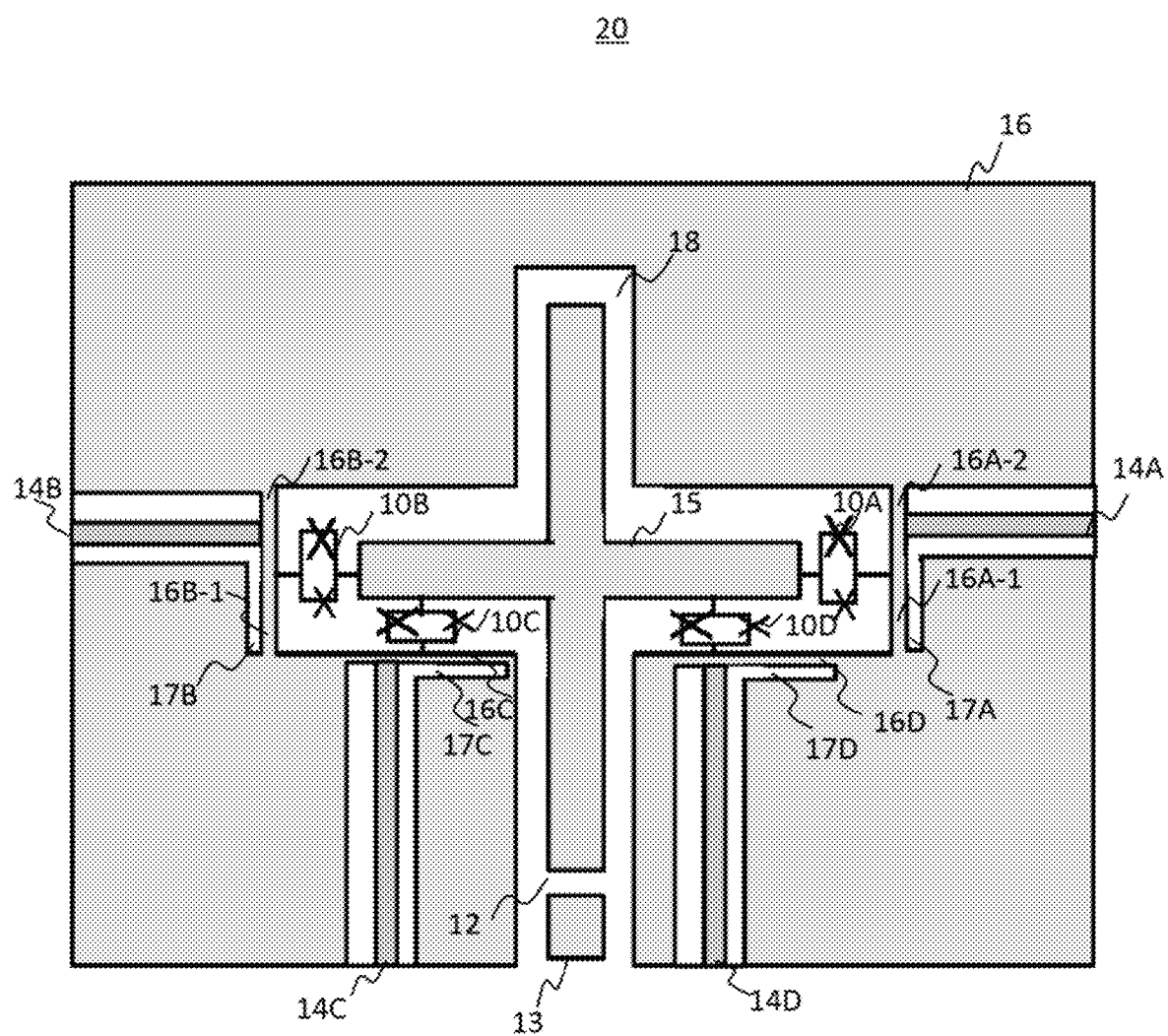
FIG. 4 is a diagram schematically illustrating a configuration example of an example embodiment.

In an example illustrated in FIG. 4, four SQUIDs 10A, 10B, 10C, and 10D are connected between the electrode 15 and the ground pattern 16, each shown in FIG. 3. Flux lines 14A, 14B, 14C, and 14D are provided for the four SQUIDs 10A, 10B, 10C, and 10D, respectively, supplying a magnetic flux $\Phi$ to a loop of each SQUID. A power supplies (current source) not shown supply a direct current signal to each of the flux lines 14A, 14B, 14C, and 14D. For the four SQUIDs 10A, 10B, 10C, and 10D connected in parallel, by setting the average critical current values and the asymmetries (a ratio between the critical current values of two Josephson junctions of a SQUID) of two Josephson junctions to values different from each other, it becomes possible to achieve $2^4=16$ resonance operation points having mutually different resonance frequencies.

Figure 5:
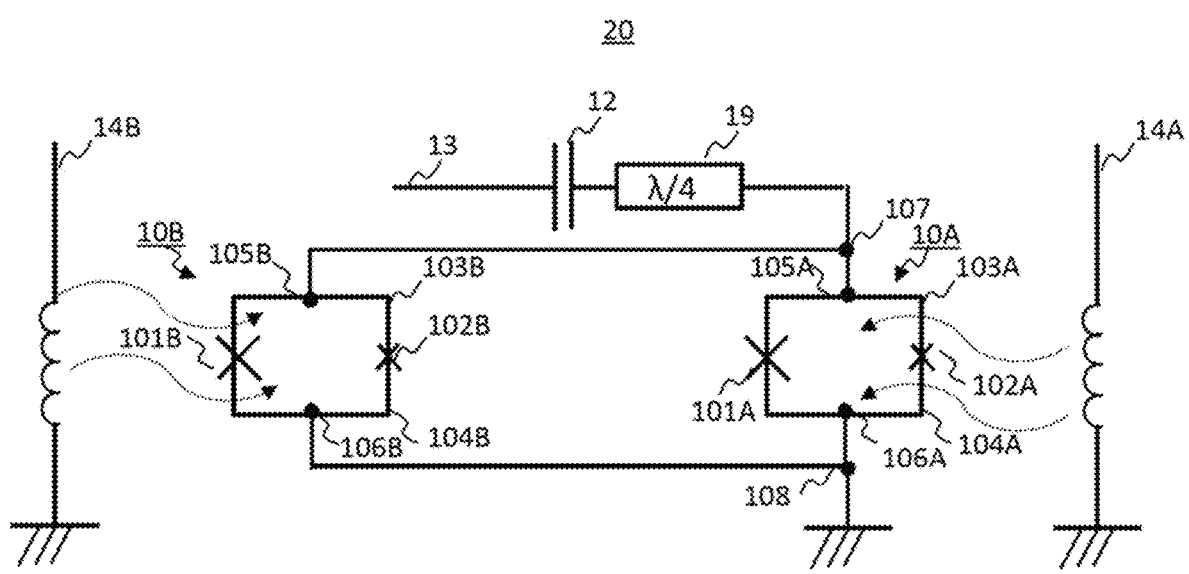
FIG. 5 is a diagram schematically illustrating a variation of an example embodiment.

In FIGS. 2A, 3, and 4, lumped element resonators are illustrated. However, the resonator of the example embodiment is not limited to the lumped element type, and a distributed element resonator such as a λ/4 resonator illustrated in FIG. 5 may be used. Referring to FIG. 5, a waveguide (λ/4 waveguide) 19 having a length close to a quarter of a resonance wavelength A. (a wavelength of a standing wave) is provided between an input/output capacitor 12 and a node 107 which is a common node between first nodes 105A and 105B of the SQUIDs 10A and 10B. The λ/4 waveguide 19 is terminated at the ground via the SQUIDs 10A and 10B. In FIG. 5, a capacitor 11 illustrated in FIG. 2A is not shown which is connected in parallel to the SQUIDs 10A and 10B of the lumped element resonator 20. In the distributed element resonator 20 in FIG. 5, a distributed capacitance includes capacitance components between the SQUIDs 10A and 10B and the ground pattern and a capacitance component between the λ/4 waveguide 19 and the ground pattern. Since each of the Josephson junctions 101A, 102A, 101B, and 102B of the SQUIDs 10A and 10B also has a minute capacitance component, the distributed capacitance may include the capacitance components of these Josephson junctions.

Figure 6A:
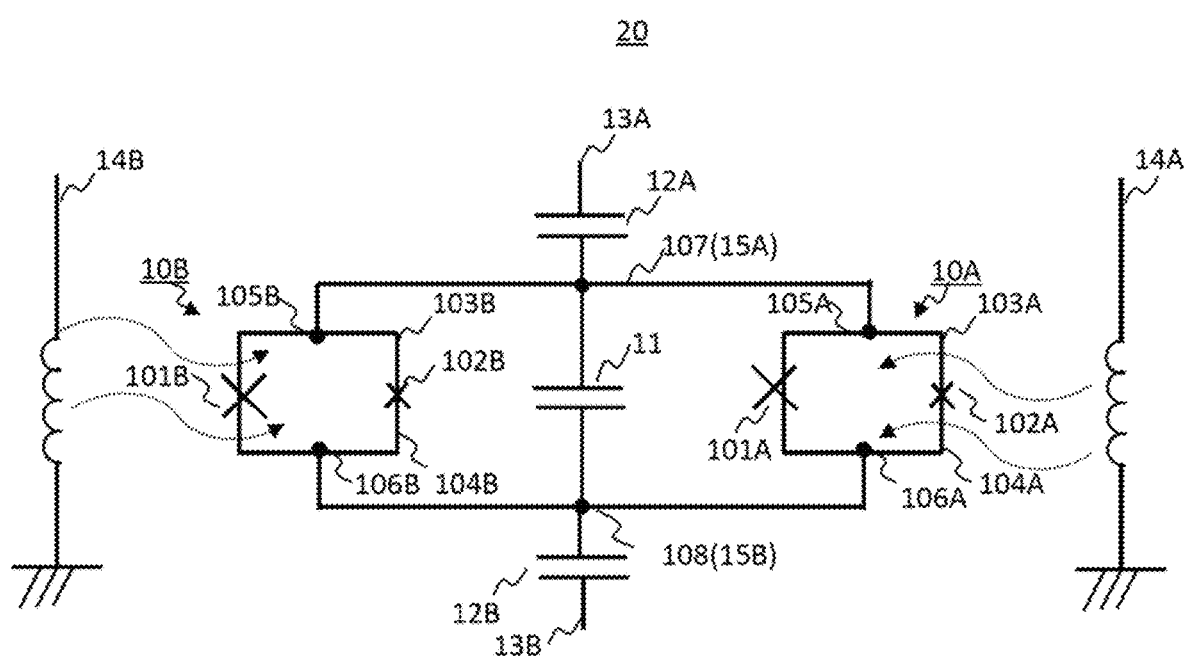
FIG. 6A is a diagram illustrating a configuration example of another example embodiment.
Figure 6B:
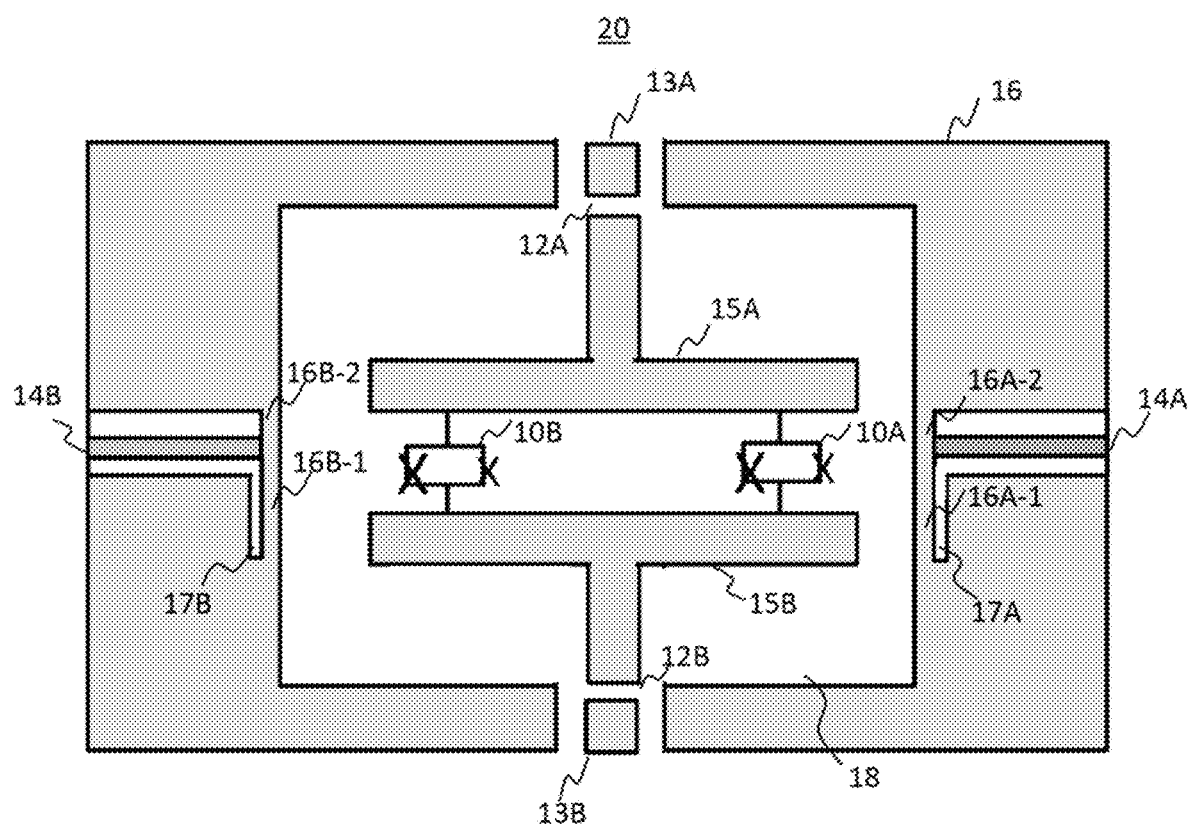
FIG. 6B is a diagram schematically illustrating a configuration example of another example embodiment.

FIGS. 6A and 6B are diagrams illustrating a second example embodiment of the present invention. Referring to FIG. 6B, a resonator 20 includes two electrodes 15A and 15B bridged by two SQUIDs 10A and 10B. As illustrated in FIGS. 6A and 6B, first nodes 105A and 105B of the two SQUIDs 10A and 10B are connected to the first electrode 15A (i.e., a common connection node 107 of the first nodes 105A and 105B is the first electrode 15A). The first electrode 15A is connected to a first input/output line 13A via a first input/output capacitor 12A. Second nodes 106A and 106B of the two SQUIDs 10A and 10B are connected to the second electrode 15B (i.e., a common connection node 108 of the second nodes 106A and 106B is the second electrode 15B). The second electrode 15B is connected to a second input/output line 13B via a second input/output capacitor 12B.

In FIG. 6B, the flux lines 14A and 14B supplied with currents supplied thereto generate magnetic fluxes penetrating through the loops of the SQUIDs 10A and 10B, respectively. The flux lines 14A and 14B, the ground lines 16A-1, 16A-2, 16B-1, and 16B-2, and the notches 17A and 17B have the same patterns and functions as those in FIG. 3 described above. Since the example illustrated in FIG. 6B is a plane circuit, the magnetic fluxes penetrating through the loops of three or more SQUIDs cannot be individually manipulated from the flux lines, as illustrated in FIG. 4.

Figure 7:
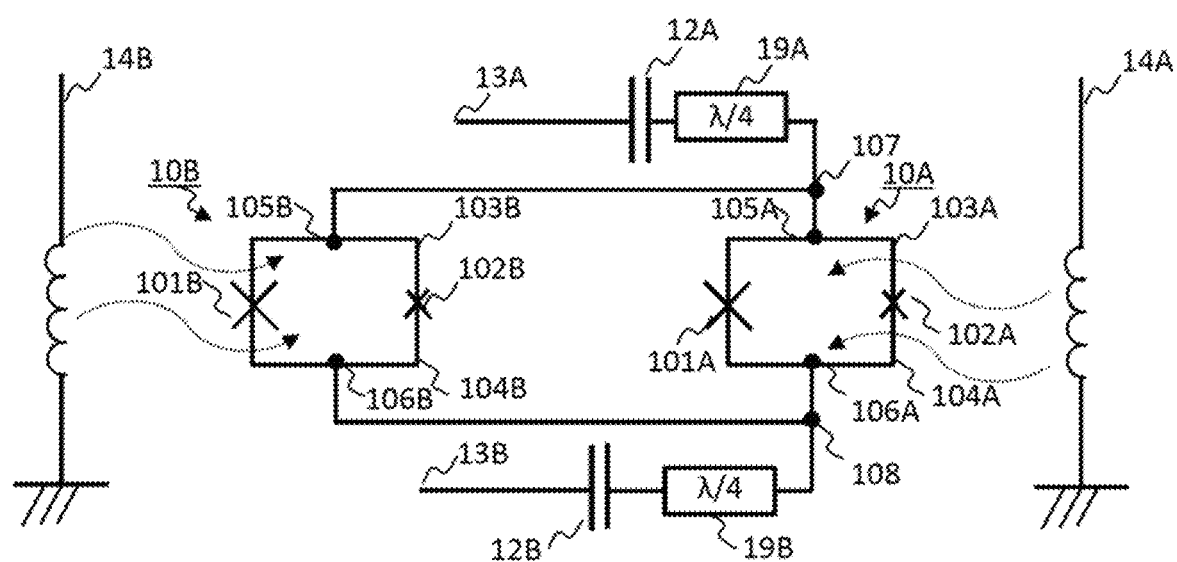
FIG. 7 is a diagram illustrating a variation of another example embodiment.

In the second example embodiment, the resonator 20 may be constituted as a distributed element resonator such as a λ/2 resonator as shown in FIG. 7. The first nodes 105A and 105B of the SQUIDs 10A and 10B are connected to one end of a waveguide (λ/4 waveguide) 19A having a length close to a quarter of a resonance wavelength A. (the wavelength of a standing wave), and the other end of the waveguide 19A is connected to the first input/output line 13A via the first input/output capacitor 12A. The second nodes 106A and 106B of the SQUIDs 10A and 10B are connected to one end of a waveguide (λ/4 waveguide) 19B having a length close to a quarter of the resonance wavelength (the wavelength of the standing wave), and the other end of the waveguide 19B is connected to the second input/output line 13B via the second input/output capacitor 12B. In FIG. 7, the capacitor 11 is not shown which is connected in parallel to the SQUIDs 10A and 10B of the lumped element resonator 20 as illustrated in FIG. 2. In the distributed element resonator 20 in FIG. 7, a distributed capacitance includes, for instance, capacitance components between the SQUIDs 10A and 10B and the ground pattern and capacitance components between the λ/4 waveguides 19A and 19B and the ground pattern. Since each of the Josephson junctions 101A, 102A, 101B, and 102B of the SQUIDs 10A and 10B also has a minute capacitance component, the distributed capacitance may include the capacitance components of these Josephson junctions.

Figure 8:
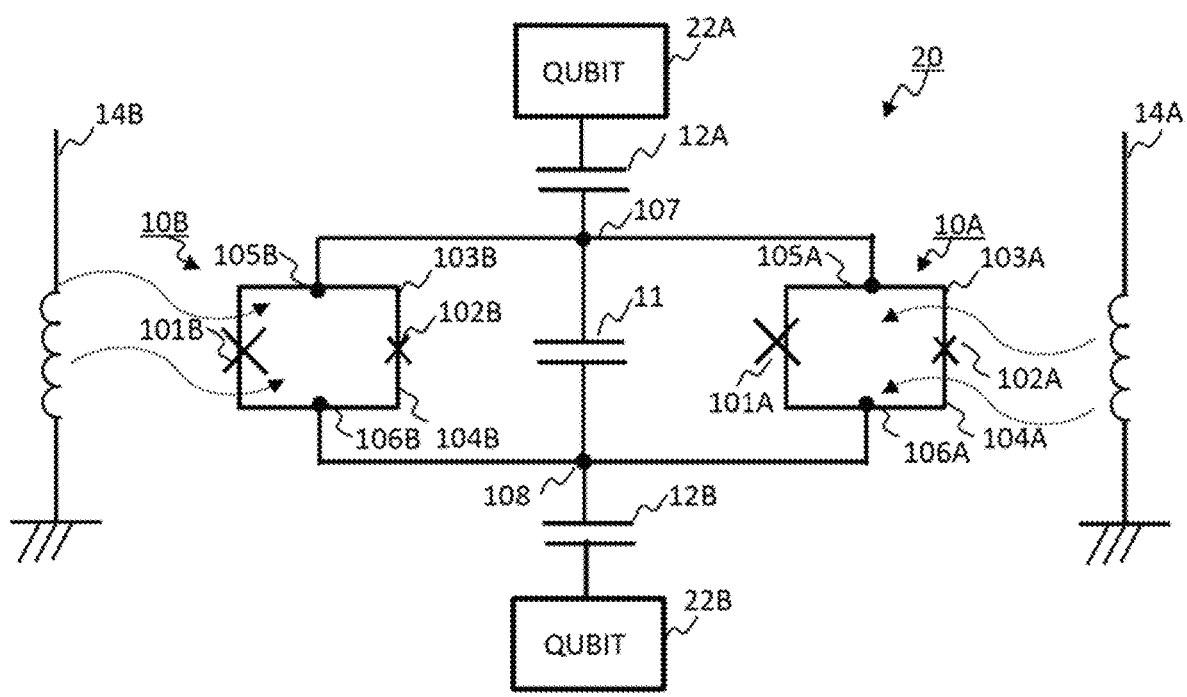
FIG. 8 is a diagram illustrating a variation of another example embodiment.

In FIG. 6A, a connection node of the first nodes 105A and 105B and a connection node of the second nodes 106A and 106B of the SQUIDs 10A and 10B are connected to the first and the second input/output lines 13A and 13B, via the first and the second input/output capacitors 12A and 12B, respectively, but the second example embodiment is not limited to such a configuration. As a variation of the second example embodiment, the connection node of the first nodes 105A and 105B and the connection node of the second nodes 106A and 106B of the SQUIDs 10A and 10B may be connected to another qubit (not shown) and to ground, respectively. In a case where one connection node is connected to ground and the other is connected to an input/output line, the circuit operates as a qubit. As illustrated in FIG. 8, in a case where a node 107 which is a common connection node of the first nodes 105A and 105B of the SQUIDs 10A and 10B, and a node 108 which is a common connection node of the second nodes 106A and 106B, are connected to first and second qubits (quantum bits) 22A and 22B, respectively, the resonator 20 operates as a qubit coupler which causes a plurality of qubits to be mutually couple.

Figure 9:
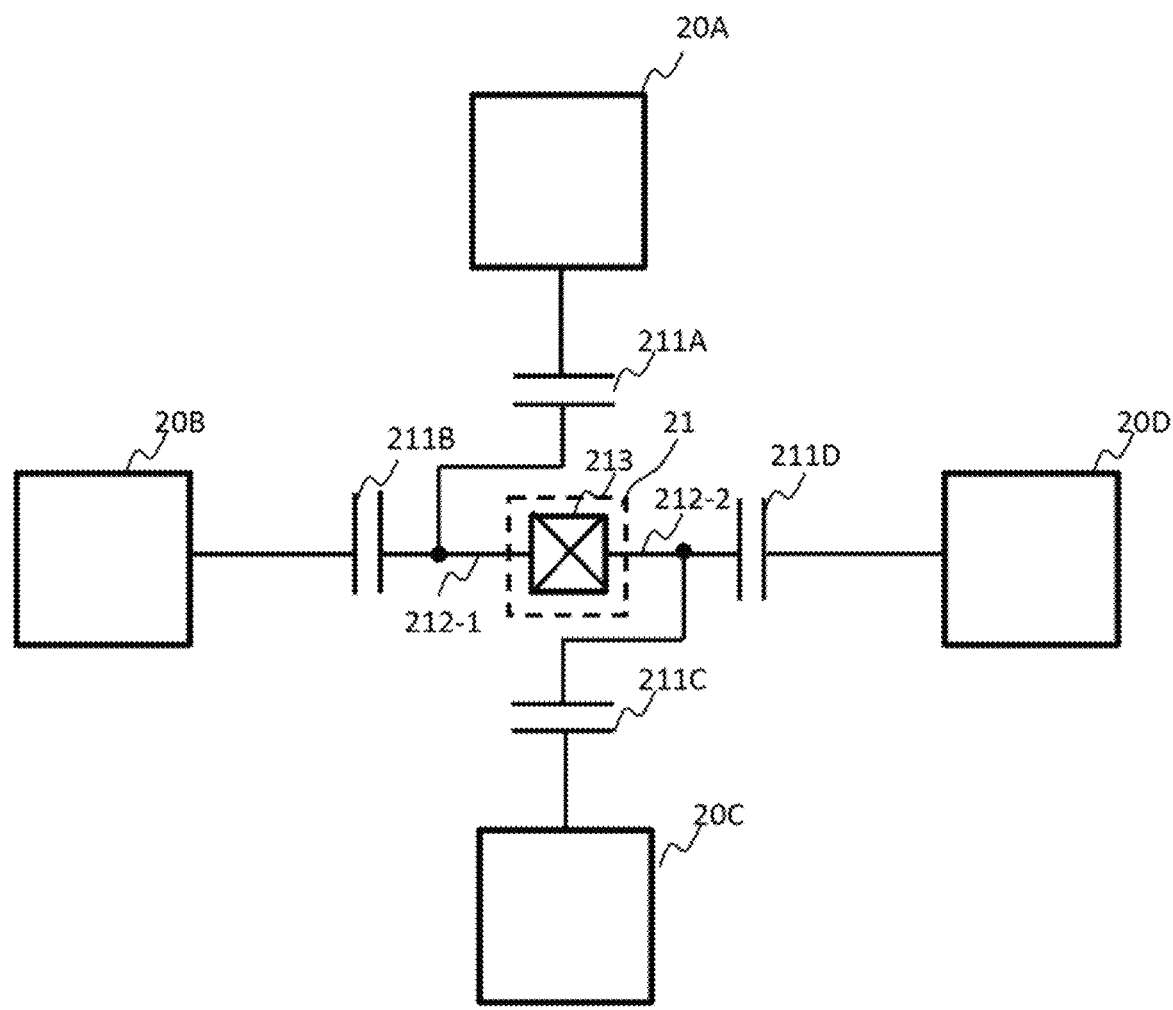
FIG. 9 is a diagram illustrating still another example embodiment.

As stated above, the resonator 20 of the example embodiment may be used as a qubit or as a qubit coupler. The following describes an example of using the resonator of the example embodiment described above, as a qubit circuit used in a quantum computer. The quantum computer is assumed to be a quantum annealing computer to compute a solution to a combinatorial optimization problem that can be mapped onto an Ising model. In the quantum computer illustrated in FIG. 9, four resonators 20A to 20D interconnects with each other via a coupling circuit (qubit coupler) 21. The coupling circuit 21, which couples the four resonators 20A to 20D, may include a Josephson junction 213. The resonators 20A and 20B are connected via capacitors 211A and 211B to one end of a superconducting conductor (electrode) 212-1 of the coupling circuit 21, where the other end of the superconducting conductor 212-1 is connected to one end of the Josephson junction 213. The resonators 20C and 20D are connected via capacitors 211C and 211D to one end of a superconducting conductor (electrode) 212-2 of the coupling circuit 21, where the other end of the superconducting conductor 212-2 is connected to the other end of the Josephson junction 213. In FIG. 9, the quantum computer with four resonators 20A to 20D (qubits) is illustrated, but a quantum computer on which any number of the resonators are integrated may be realized by using the configuration illustrated in FIG. 9, as a unit structure and arranging and connecting a plurality of the unit structures.

Each disclosure of Patent Literatures 1 and 2 cited above is incorporated herein in its entirety by reference thereto. It is to be noted that it is possible to modify or adjust the example embodiments or examples within the whole disclosure of the present invention (including the Claims) and based on the basic technical concept thereof. Further, it is possible to variously combine or select a wide variety of the disclosed elements (including the individual elements of the individual claims, the individual elements of the individual examples) and the individual elements of the individual figures) within the scope of the Claims of the present invention. That is, it is self-explanatory that the present invention includes any types of variations and modifications to be done by a skilled person according to the whole disclosure including the Claims, and the technical concept of the present invention.

APPENDIX

The following describes the derivation of the equation (7). Currents $I_1$ and $I_2$ flowing through the two Josephson junctions of an asymmetric SQUID are as follows:

$$I_1 = I_0(1+x) \quad (A.1)$$

$$I_2 = I_0(1-x) \quad (A.2)$$

$$I_1 + I_2 = 2I_0 \quad (A.3)$$

The current I flowing through the asymmetric SQUID is given as follows:

$$I = I_0(1+x)*\sin(\gamma A) + I_0(1-x)*\sin(\gamma B) \quad (A.4)$$

The equation (A.4) can be rewritten by using $$\gamma B - \gamma A = 2\pi\Phi/\Phi_0 \quad (A.5)$$

as follows:

$$I = I_0(1+x)*\sin(\gamma_A) + I_0(1-x)*\sin(\gamma_A - 2\pi\Phi/\Phi_0)\} =$$
$$I_0\{\sin(\gamma_A) + \sin(\gamma_A - 2\pi\Phi/\Phi_0)\} + xI_0\{\sin(\gamma_A) - \sin(\gamma_A - 2\pi\Phi/\Phi_0)\} =$$
$$2I_0[\cos(\pi\Phi/\Phi_0)\sin\{\gamma_A - \pi\Phi/\Phi_0)\}] +$$
$$2xI_0[\sin(\pi\Phi/\Phi_0)\cos\{\gamma_A - \pi\Phi/\Phi_0)\}] =$$
$$2I_0[\cos(\pi\Phi/\Phi_0)\{\sin(\gamma_A)\cos(\pi\Phi/\Phi_0) - \sin(\pi\Phi/\Phi_0)\cos(\gamma_A)\}] +$$
$$2xI_0[\sin(\pi\Phi/\Phi_0)\{\cos(\gamma_A)\cos(\pi\pi\Phi/\Phi_0) + \sin(\gamma_A)\sin(\pi\Phi/\Phi_0)\}] =$$
$$2I_0\left\{\cos^2(\pi\Phi/\Phi_0) + x\sin^2(\pi\Phi/\Phi_0)\right\}\sin(\gamma_A) +$$
$$2I_0\{-\sin(\pi\Phi/\Phi_0)\cos(\pi\Phi/\Phi_0) + x\cos(\pi\Phi/\Phi_x)\sin(\pi\Phi/\Phi_0)\}\cos(\gamma_A) =$$
$$2I_0\{\cos^2(\pi\Phi/\Phi_0) + x\sin^2(\pi\Phi/\Phi_0)\}\sin(\gamma_A) -$$
$$2I_0(1-x)\sin(\pi\Phi/\Phi_0)\cos(\pi\Phi/\Phi_0)\cos(\gamma_A)$$

$$(A.6)$$

Letting $$\alpha = \{\cos^2(\pi\Phi/\Phi_0) + x\sin^2(\pi\Phi/\Phi_0)\} \quad (A.7)$$

and $$\beta = (1-x)\sin(\pi\Phi/\Phi_0)\cos(\pi\Phi/\Phi_0) \quad (A.8)$$

the equation (A.6) can be rewritten as follows:

$$I = 2I_0[\alpha \sin(\gamma_A) + \beta \cos(\gamma_A)] = 2I_0\sqrt{(\alpha^2+\beta^2)}\sin(\gamma_A+C) \quad (A.9)$$

where $$\cos(C) = \alpha/\sqrt{(\alpha^2+\beta^2)}, \sin(C) = \beta/\sqrt{(\alpha^2+\beta^2)} \quad (A.10)$$

Calculating inside the square root of equation (A.9) gives the following equation (A.11):

$$\sqrt{(\alpha^2+\beta^2)} = ([\cos^2(\pi\Phi/\Phi_0) + x\sin^2(\pi\Phi/\Phi_0)]^2 + \quad (A.11)$$
$$[(1-x)\sin(\pi\Phi/\Phi_0)\cos(\pi\Phi/\Phi_0)]^2)^{1/2} = ([\cos^4(\pi\Phi/\Phi_0) +$$
$$\cos^2(\pi\Phi/\Phi_0)\sin^2(\pi\Phi/\Phi_0)] + x^2[\sin^4(\pi\Phi/\Phi_0) +$$
$$\cos^2(\pi\Phi/\Phi_0)\sin^2(\pi\Phi/\Phi_0)])^{1/2} =$$
$$([\cos^2(\pi\Phi_0)(\cos^2(\pi\Phi/\Phi_0) + \sin^2(\pi\Phi/\Phi_0)] +$$
$$x^2[\sin^2(\pi\Phi/\Phi_0)(\sin^2(\pi\Phi/\Phi_0) + \cos^2(\pi\Phi/\Phi_0))])^{1/2} =$$
$$\sqrt{\{\cos^2(\pi\Phi/\Phi_0) + x^2\sin^2(\pi\Phi/\Phi_0)\}}$$

From above, the equation (A.9) can be rewritten as follows:

$$I = 2I_0\{\cos^2(\pi\Phi/\Phi_0) + x^2\sin^2(\pi\Phi/\Phi_0)\}^{1/2}\sin(\gamma A + C) =$$

$$A \sin(\gamma A + C) \quad (A.12)$$

where $$A = 2I_0\{\cos^2(\theta) + x^2\sin^2(\theta)\}^{1/2} (\theta = \pi\Phi/\Phi_0) \quad (A.13)$$

Since $$|I| \leq A \quad (A.14)$$

the amplitude A in equation (A.13) can be regarded as the maximum value (the critical current value) of the current flowing through the asymmetric SQUID.

What is claimed is:

1. A superconducting quantum circuit comprising
    a plurality of SQUIDs (Superconducting Quantum Interference Devices) connected in parallel,
    each SQUID of the plurality of SQUIDs including a first superconducting line, a first Josephson junction, a second superconducting line, and a second Josephson junction connected in a loop, wherein a junction area of the first Josephson junction and a junction area of the second Josephson junction are different from each other,
    wherein the plurality of SQUIDs are configured to be mutually different in either one or both of:
        a sum of the junction area of the first Josephson junction and the junction area of the second Josephson junction; and
        a ratio of the junction area of the first Josephson junction to the junction area of the second Josephson junction.

2. The superconducting quantum circuit according to claim 1, further comprising
    an electrode, the plurality of SQUIDs being bridged between the electrode and ground.

3. The superconducting quantum circuit according to claim 1, further comprising
    first and second electrodes, the plurality of SQUIDs being bridged therebetween.

4. The superconducting quantum circuit according to claim 1, comprising
    a plurality of current supply lines provided in correspondence with the plurality of SQUIDs, each current supply line individually generating a magnetic flux penetrating through the loop of each of the plurality of SQUIDs.

5. The superconducting quantum circuit according to claim 4, comprising
a substrate including on a surface thereof:
the plurality of SQUID;
the plurality of current supply lines arranged respectively for the plurality of SQUID; and
a ground plane including ground patterns to face the current supply line at least along both sides of the current supply line in a longitudinal direction, formed on the a surface of the substrate,
wherein the ground plane further includes:
a ground line including first and second line portions provided in contact with a longitudinal end of the current supply line on one longitudinal side thereof, and facing the SQUID on an opposite longitudinal side thereof, the first and second line portions extending in mutually opposite directions along a direction orthogonal to the current supply line from a contact portion with the longitudinal end of the current supply line; and
a notch provided running along the one longitudinal side of one of the first and the second lines portions of the ground line.

6. The superconducting quantum circuit according to claim 5, comprising
an electrode including a first arm and a second arms mutually elongated in opposite directions,
wherein the ground line includes a first ground line and a second ground line, and
wherein the plurality of SQUID include a first SQUID bridged between a longitudinal end portion of the first arm and the first ground line and a second SQUID bridged between a longitudinal end portion of the second arm and the second ground line.

7. The superconducting quantum circuit according to claim 6, wherein the electrode includes a third arm and a fourth arm mutually elongated in opposite directions perpendicular to the first arm and the second arm, one of longitudinal ends of the third arm and the fourth arm capacitively coupled to an input/output line.

8. The superconducting quantum circuit according to claim 7, wherein the ground line includes further one or more ground lines, and
wherein the plurality of SQUID include further one or more SQUIDs bridged between a longitudinal side of at least one of the first to fourth arms of the electrode and the one or more ground lines.

9. The superconducting quantum circuit according to claim 1, wherein the plurality of SQUIDs are configured to be mutually different in either one or both of:
a sum of the critical current value of the first Josephson junction and the critical current value of the second Josephson junction; and
a ratio of the critical current value of the first Josephson junction to the critical current value of the second Josephson junction.

10. The superconducting quantum circuit according to claim 1, comprising N number (N is an integer of two or more) of the SQUIDs connected in parallel, wherein the number of operation points, at each of which a gradient of resonance frequency with respect to a magnetic flux applied to the SQUID is zero is Nth power of two.

11. The superconducting quantum circuit according to claim 1, wherein the superconducting quantum circuit is constituted as a lumped element circuit.

12. The superconducting quantum circuit according to claim 1, wherein the superconducting quantum circuit is constituted as a distributed element circuit.

13. The superconducting quantum circuit according to claim 1, further comprising
an electrode including first to fourth arms, wherein the plurality of SQUIDs include one or more SQUIDs bridged between at least one of the first to fourth arms of the electrode and ground.

14. A quantum device comprising a qubit circuit and/or a qubit coupler causing a plurality of qubits to be mutually coupled, the qubit circuit and/or the qubit coupler including the superconducting quantum circuit that includes
a plurality of SQUIDs (Superconducting Quantum Interference Devices) connected in parallel,
each SQUID of the plurality of SQUIDs including a first superconducting line, a first Josephson junction, a second superconducting line, and a second Josephson junction connected in a loop, wherein a junction area of the first Josephson junction and a junction area of the second Josephson junction are different from each other,
wherein the plurality of SQUIDs are configured to be mutually different in either one or both of:
a sum of the junction area of the first Josephson junction and the junction area of the second Josephson junction; and
a ratio of the junction area of the first Josephson junction to the junction area of the second Josephson junction.

15. A quantum computer including a plurality of qubits and a qubit coupler that causes the plurality of qubits to be mutually coupled, at least one of the qubits and the qubit coupler comprising the superconducting quantum circuit that includes
a plurality of SQUIDs (Superconducting Quantum Interference Devices) connected in parallel,
each SQUID of the plurality of SQUIDs including a first superconducting line, a first Josephson junction, a second superconducting line, and a second Josephson junction connected in a loop, wherein a junction area of the first Josephson junction and a junction area of the second Josephson junction are different from each other,
wherein the plurality of SQUIDs are configured to be mutually different in either one or both of:
a sum of the junction area of the first Josephson junction and the junction area of the second Josephson junction; and
a ratio of the junction area of the first Josephson junction to the junction area of the second Josephson junction.

* * * * *